US010293802B2

(12) United States Patent
Koga et al.

(10) Patent No.: US 10,293,802 B2
(45) Date of Patent: May 21, 2019

(54) VEHICLE CONTROL DEVICE AND VEHICLE BRAKE SYSTEM

(71) Applicants: NISSIN KOGYO CO., LTD., Ueda-shi, Nagano (JP); HONDA MOTOR CO., LTD., Minato-ku, Tokyo (JP)

(72) Inventors: Yusuke Koga, Ueda (JP); Sekihei Shimozono, Ueda (JP); Yoshifumi Kurosawa, Wako (JP); Keishiro Kikuchi, Wako (JP)

(73) Assignees: Autoliv Nissin Brake Systems Japan Co., Ltd., Nagano (JP); Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 14/887,519

(22) Filed: Oct. 20, 2015

(65) Prior Publication Data

US 2016/0113155 A1 Apr. 21, 2016

(30) Foreign Application Priority Data

Oct. 21, 2014 (JP) .................................. 2014-214701

(51) Int. Cl.
*H05K 7/20* (2006.01)
*B60T 17/00* (2006.01)
(Continued)

(52) U.S. Cl.
CPC ................ *B60T 17/00* (2013.01); *B60T 5/00* (2013.01); *B60T 7/042* (2013.01); *B60T 8/368* (2013.01);
(Continued)

(58) Field of Classification Search
CPC ........ B60T 8/368; B60T 13/58; B60T 13/146; B60T 13/662; B60T 13/745;
(Continued)

(56) References Cited

U.S. PATENT DOCUMENTS 6,059,382 A 5/2000 Schoettl
6,634,723 B1 * 10/2003 Ganzel .................... B60T 8/368
303/119.3
(Continued)

FOREIGN PATENT DOCUMENTS

CN 101426350 A 5/2009
CN 103957684 A 7/2014
(Continued)

OTHER PUBLICATIONS

Extended European Search Report dated Feb. 22, 2016 corresponding to European Application No. 15 190 557.7.
(Continued)

*Primary Examiner* — Xuan Lan Nguyen
(74) *Attorney, Agent, or Firm* — Carrier Blackman & Associates, P.C.; Joseph P. Carrier; Jeffrey T. Gedeon

(57) ABSTRACT

A vehicle control device is an input device that includes a metallic base substance and an electronic control device mounted on the base substance. The electronic control device includes a housing mounted on a mounting face of the base substance and a control board housed in the housing. A heat dissipating part which is inserted into the housing is provided to protrude from the mounting face, and the heat dissipating part abuts on the control board.

4 Claims, 5 Drawing Sheets

(51) Int. Cl.
*B60T 8/36* (2006.01)
*F16D 65/78* (2006.01)
*B60T 5/00* (2006.01)
*B60T 7/04* (2006.01)
*B60T 11/20* (2006.01)
*B60T 13/16* (2006.01)
*B60T 13/66* (2006.01)
*B60T 13/68* (2006.01)
*B60T 8/40* (2006.01)

(52) U.S. Cl.
CPC ............ *B60T 11/20* (2013.01); *B60T 13/166* (2013.01); *B60T 13/662* (2013.01); *B60T 13/686* (2013.01); *F16D 65/78* (2013.01); *H05K 7/20854* (2013.01); *B60T 8/4081* (2013.01)

(58) Field of Classification Search
CPC ... B60T 13/686; B60T 17/00; H05K 7/20854; H05K 7/1427; H05K 7/20418
USPC ............................................ 303/119.2, 119.3
See application file for complete search history.

(56) References Cited

U.S. PATENT DOCUMENTS

| | | | | |
|---|---|---|---|---|
| 8,447,485 | B2* | 5/2013 | Koyama | B60T 8/368 303/3 |
| 2008/0060889 | A1* | 3/2008 | Tsuruta | B60T 8/3675 188/110 |
| 2009/0250998 | A1 | 10/2009 | Hinz et al. | |
| 2011/0062775 | A1* | 3/2011 | Iyatani | B60T 8/368 303/20 |
| 2012/0195007 | A1* | 8/2012 | Yanai | B60T 13/686 361/720 |
| 2012/0298897 | A1* | 11/2012 | Nakamura | B60T 8/3675 251/129.15 |
| 2013/0232966 | A1* | 9/2013 | Murayama | B60T 7/042 60/545 |
| 2014/0298797 | A1 | 10/2014 | Murayama et al. | |
| 2016/0278245 | A1* | 9/2016 | Koga | H05K 7/20854 |

FOREIGN PATENT DOCUMENTS

| | | |
|---|---|---|
| EP | 0856447 A2 | 8/1998 |
| EP | 0 856 447 A3 | 1/1999 |
| EP | 2783931 A1 | 10/2014 |
| JP | 2006-269980 A | 10/2006 |
| JP | 2008-062825 A | 3/2008 |
| JP | 2008168837 A | 7/2008 |
| JP | 2013-112082 A | 6/2013 |
| WO | 2006125732 A1 | 11/2006 |

OTHER PUBLICATIONS

Office Action drafted Aug. 22, 2017, issued in the corresponding Japanese Patent Application 2014-214701 with the English translation thereof.

Office Action dated Sep. 10, 2018 issued in the corresponding Chinese patent application 201510683958.X with the English translation thereof.

* cited by examiner

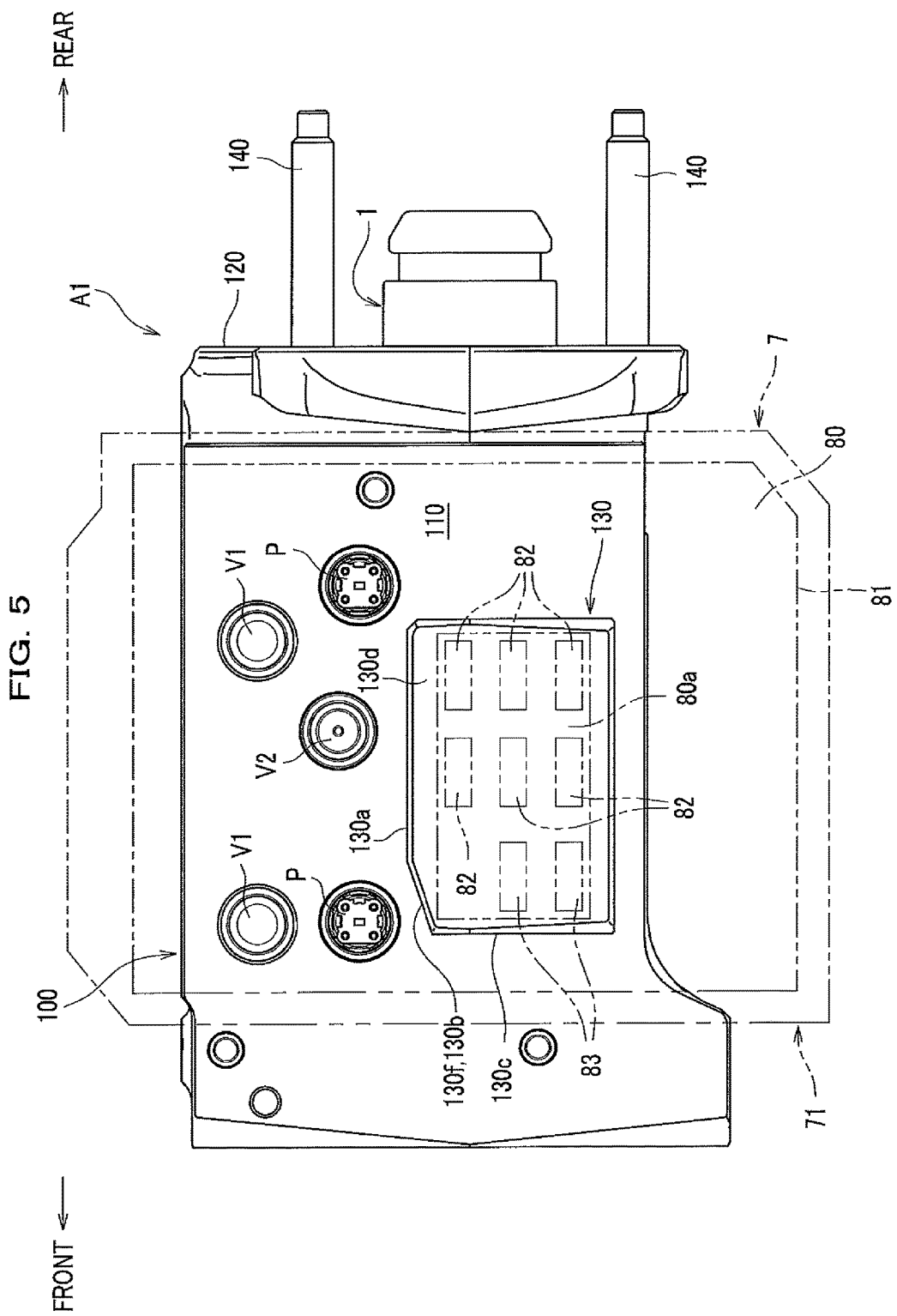

VEHICLE CONTROL DEVICE AND VEHICLE BRAKE SYSTEM

CROSS-REFERENCE TO RELATED APPLICATION

This application is based upon and claims the benefit of priority to the Japanese Patent Application No. 2014-214701, filed on Oct. 21, 2014, the entire contents of which are incorporated herein by reference.

BACKGROUND OF THE INVENTION

1. Field of the Invention

The present invention relates to a vehicle control device and a vehicle brake system using the vehicle control device.

2. Description of the Related Art

Examples of an electronic control device used in a vehicle brake system include an electronic control device which is provided with a box-shaped housing attached to a base substance, a control board housed in the housing, and a metallic heat dissipating plate attached to one surface of the control board (see, for example, Patent Document 1: Japanese Patent Application Publication No. 2006-269980).

In such an electronic control device, heat of the control board is conducted to the heat dissipating plate to cause the heat of the control board to be dissipated.

The above conventional electronic control device makes it impossible to size up the heat dissipating plate because the heat dissipating plate is housed in the housing, and allows the heat dissipating plate to be housed in an enclosed space in the housing. Consequently, the conventional electronic control device has posed a problem in that heat of the control board is hard to dissipate.

SUMMARY OF THE INVENTION

The present invention has been made to solve the above problems, and an object of the invention is to provide a vehicle control device and a vehicle brake system using the vehicle control device that are capable of effectively dissipating heat of a control board.

In order to solve the above problems, the present invention provides as one aspect thereof a vehicle control device including: a metallic base substance; an electronic control device mounted on the base substance, the electronic control device including a housing mounted on a mounting face of the base substance and a control board housed in the housing; and a heat dissipating part which is provided to protrude from the mounting face and inserted into the housing, the heat dissipating part abutting on the control board.

In this configuration, heat of the control board is conducted from the heat dissipating part to the entire base substance. Moreover, the base substance is a metallic block which is disposed in a large space such as an engine room, thereby allowing heat to be efficiently dissipated from the base substance. Accordingly, even where the amount of heat generation of the control board is large, the heat of the control board can be sufficiently dissipated through the base substance.

In the vehicle control device described above, where such a configuration that the heat dissipating part abuts on the control board through a heat conducting member is adopted, heat of the control board is efficiently conducted to the base substance through the heat conducting member.

In the vehicle control device described above, where an electronic component such as a resistance component, a transistor or the like is mounted on a component mounting area provided on the control board, it is desirable that the heat dissipating part is allowed to abut on a reverse side of the component mounting area on the control board to conduct heat of the electronic component directly to the base substance.

In the vehicle control device described above, the housing may include a partition member formed to partition an inner space of the housing into spaces, a first housing chamber which is formed between the partition member and the mounting face, and a second housing chamber which is formed on the side opposite to the side of the mounting face across the partition member and into which the control board is housed. In this case, the partition member has an opening and the heat dissipating part is inserted into the opening, thereby making it possible to allow the heat dissipating part to abut on the control board in the second housing chamber.

In the vehicle control device described above, where an electric component such as a solenoid valve, a sensor or the like is mounted on the mounting face, it is desirable that the heat dissipating part and the electric component are provided side by side in the housing to make effective use of space in the housing.

In the vehicle control device described above, where a cut-out portion is formed on a face of the heat dissipating part on the side of the electric component, the cut-out portion being set back toward the side opposite to the side of the electric component, the heat dissipating part and the electric component can be compactly arranged and thus the housing can be downsized.

When the vehicle control device described above is installed in a vehicle, such a configuration that the heat dissipating part is located below the electric component in a vertical direction can be adopted. In this configuration, heat of the electric component is dissipated upward, thereby preventing the heat of the electric component from being conducted to the control board through the heat dissipating part.

Moreover, the present invention provides as another aspect thereof a vehicle brake system including the vehicle control device as one aspect of the present invention described above, and a slave cylinder that generates a brake hydraulic pressure through driving of an electric actuator. The vehicle control device includes the base substance which has a cylindrical bore, a piston which is inserted into the cylindrical bore and to which a brake operation unit is connected, and the electronic control device that controls the electric actuator.

Where the electronic control device controls operations of the vehicle control device and the slave cylinder as in the vehicle brake system according to the present invention, the amount of heat generation of the control board becomes large in some cases. The vehicle control device according to the present invention, however, makes it possible to sufficiently dissipate the heat of the control board through the base substance.

The vehicle control device according to the present invention, and the vehicle brake system using the vehicle control device, allow the heat dissipating part of the base substance to abut on the control board to effectively dissipate heat from the base substance, thereby making it possible to sufficiently dissipate the heat of the control board through the base substance and to suppress an increase in temperature of the control board.

BRIEF DESCRIPTION OF THE DRAWINGS

FIGS. 3A and 3B are views showing the input device according to the embodiment of the present invention, in which FIG. 3A is a front view and FIG. 3B is a rear view.

FIG. 5 is a left side view showing the input device according to the present embodiment.

DETAILED DESCRIPTION OF THE EMBODIMENTS

An embodiment of a vehicle control device according to the present invention will be described in detail with reference to the accompanying drawings as appropriate.

The present embodiment is described, taking a case in which the vehicle control device according to the present invention is applied to an input device of a vehicle brake system, for example.

In the description below, an overall configuration of the vehicle brake system is first described, and the input device which is the vehicle control device according to the present invention is subsequently described in detail.

Figure 1:
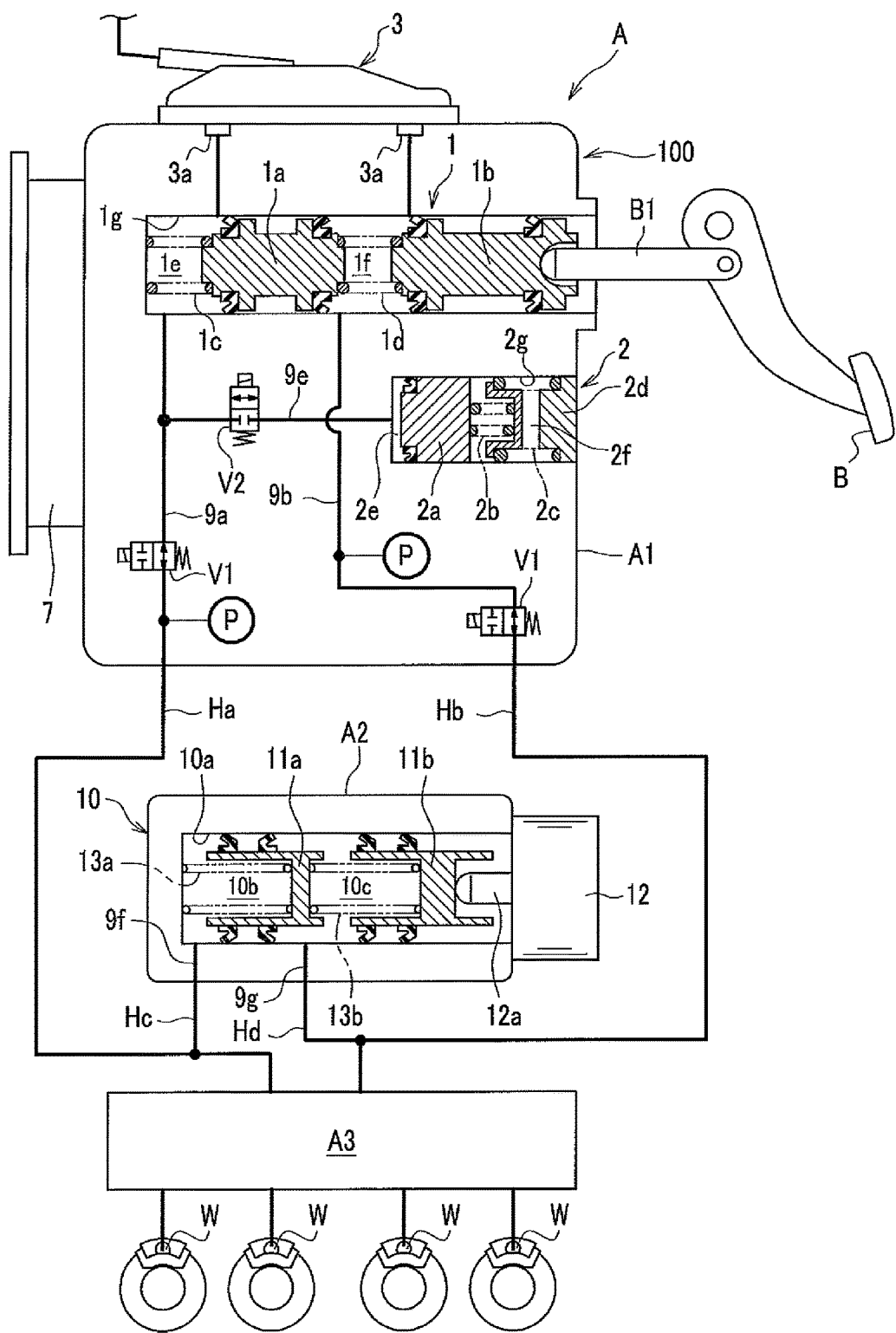
FIG. 1 is a schematic diagram showing a vehicle brake system using an input device according to an embodiment of the present invention.

As shown in FIG. 1, the vehicle brake system A is configured to include both a by-wire brake system that operates at the time of startup of a prime mover (an engine, an electric motor or the like), and a hydraulic brake system that operates at the time of stop of the prime mover.

The vehicle brake system A can be installed not only in an automobile that is powered only by an engine (internal combustion), but also in a hybrid vehicle that uses a motor in conjunction with an engine, an electric vehicle or a fuel cell vehicle that is powered only by a motor, and the like.

The vehicle brake system A includes an input device A1 ("vehicle control device" set forth in the claims) that generates a brake hydraulic pressure depending on the amount of stroke (amount of actuation) of a brake pedal B ("brake operation unit" set forth in the claims).

Also, the vehicle brake system A includes a slave cylinder A2 that generates a brake hydraulic pressure by driving a motor 12 (electric actuator) depending on the amount of stroke of the brake pedal B.

Moreover, the vehicle brake system A includes a fluid pressure control device A3 that assists a stability of behavior of the vehicle, as separate devices.

The input device A1, the slave cylinder A2 and the fluid pressure control device A3 are configured as separate units and communicated with one another via external piping tubes.

Figure 2:
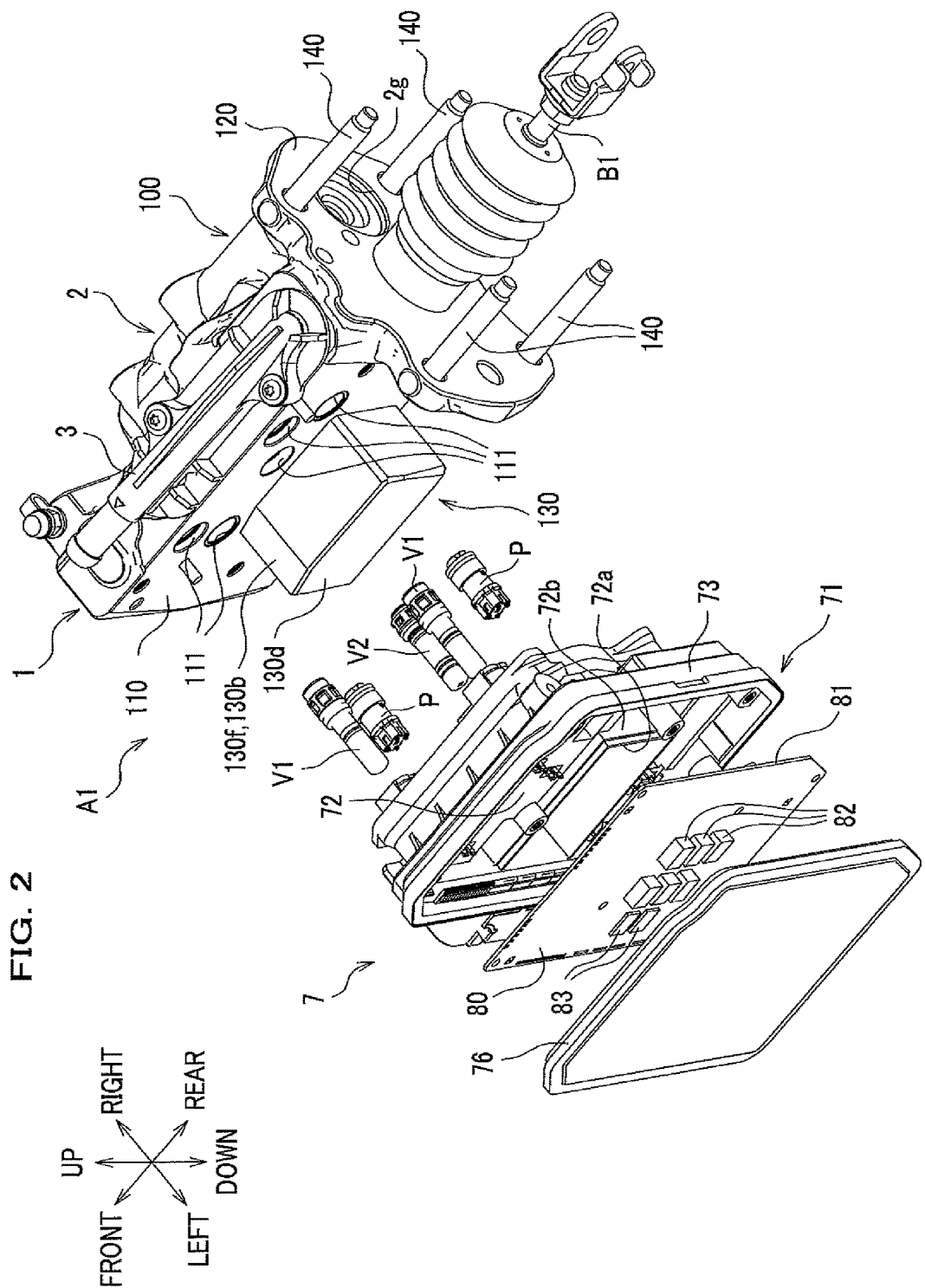
FIG. 2 is an exploded perspective view showing the input device according to the embodiment of the present invention.

The input device A1 includes a base substance 100, a master cylinder 1 that generates a brake hydraulic pressure depending on the amount of stroke of the brake pedal B, a stroke simulator 2 that gives a pseudo operational reaction force to the brake pedal B, and an electronic control device 7 (see FIG. 2).

The base substance 100 is a metallic block installed in the vehicle, in which two cylinder bores 1g, 2g and a plurality of fluid pressure passages 9a-9e are formed. Also, various components such as a reservoir 3 are mounted on the base substance 100.

The master cylinder 1 is of a tandem piston type and is constituted by two pistons 1a, 1b and two coil springs 1c, 1d. The master cylinder 1 is provided in the first cylinder bore 1g of a cylindrical shape having a bottom.

A first pressure chamber 1e is formed between the bottom of the first cylinder bore 1g and the first piston 1a. A first coil spring 1c is housed in the first pressure chamber 1e. The first coil spring 1c is adapted to push the first piston 1a which has been moved to the side of the bottom of the first cylinder bore 1g, back to the side of an opening of the first cylinder bore 1g.

A second pressure chamber 1f is formed between the first piston 1a and the second piston 1b. A second coil spring 1d is housed in the second pressure chamber 1f. The second coil spring 1d is adapted to push the second piston 1b which has been moved to the side of the bottom of the first cylinder bore 1g, back to the side of the opening of the first cylinder bore 1g.

The brake pedal B has a rod B1 which is inserted into the first cylinder bore 1g. A tip section of the rod B1 is coupled to the second piston 1b. This allows the second piston 1b to be coupled via the rod B1 to the brake pedal B.

The first piston 1a and the second piston 1b receive a pedal effort on the brake pedal B to slide to the side of the bottom within the first cylinder bore 1g, thereby pressurizing respective brake fluids in both of the pressure chambers 1e, 1f.

The reservoir 3 is a container for reserving brake fluid, and is mounted on a top face of the base substance 100 (see FIG. 2). The brake fluid is supplied from the reservoir 3 through communication holes 3a, 3a to both of the pressure chambers 1e, 1f.

The stroke simulator 2 is constituted by a piston 2a, two coil springs 2b, 2c, and a lid member 2d. The stroke simulator 2 is provided in the second cylinder bore 2g of a cylindrical shape having a bottom. An opening of the second cylinder bore 2g is occluded by the lid member 2d.

A pressure chamber 2e is formed between the bottom of the second cylinder bore 2g and the piston 2a. Also, a housing chamber 2f is formed between the piston 2a and the lid member 2d. The two coil springs 2b, 2c are housed in the housing chamber 2f. Both of the coil springs 2b, 2c are adapted to push the piston 2a which has been moved to the side of the lid member 2d, back to the side of the bottom of the second cylinder bore 2g, and to give the operational reaction force to the brake pedal B.

Next, description will be given of each of the fluid pressure passages formed in the base substance 100 of the input device A1.

A first main fluid pressure passage 9a is a fluid pressure passage which starts from the first pressure chamber 1e in the first cylinder bore 1g. A piping tube Ha leading to the fluid pressure control device A3 is connected to a lead-out port which is an end point of the first main fluid pressure passage 9a.

A second main fluid pressure passage 9b is a fluid pressure passage which starts from the second pressure chamber 1e in the first cylinder bore 1g. A piping tube Hb leading to the fluid pressure control device A3 is connected to a lead-out port which is an end point of the second main fluid pressure passage 9b.

A branch fluid pressure passage 9e is a fluid pressure passage which branches from the first main fluid pressure passage 9a to lead to the pressure chamber 2e of the stroke simulator 2.

In the first main fluid pressure passage 9a, a normally-open type solenoid valve V1 that opens and closes the first main fluid pressure passage 9a is provided at the downstream side (lead-out port side) of a place at which the first main fluid pressure passage 9a is connected to the branch fluid pressure passage 9e. This solenoid valve V1 is a master cutoff valve that is switched to a valve-closed state to break communication between the upstream side and the downstream side of the first main fluid pressure passage 9a.

A normally-open type solenoid valve V1 that opens and closes the second main fluid pressure passage 9b is provided in the second main fluid pressure passage 9b. This solenoid valve V1 is a master cutoff valve that is switched to a valve-closed state to break communication between the upstream side and the downstream side of the second main fluid pressure passage 9b.

A normally-closed type solenoid valve V2 is provided in the branch fluid pressure passage 9e. This solenoid valve V2 is adapted to open and close the branch fluid pressure passage 9e.

Two pressure sensors P, P are adapted to detect brake hydraulic pressures. Information obtained from both of the pressure sensors P, P is input to the electronic control device 7.

The pressure sensor P on the first main fluid pressure passage 9a is disposed on the downstream side of the solenoid valve V1 (on the side of the lead-out port), and detects a brake hydraulic pressure generated by the slave cylinder A2.

The pressure sensor P on the second main fluid pressure passage 9b is disposed on the upstream side of the solenoid valve V1 (on the side of the master cylinder 1), and detects a brake hydraulic pressure generated by the master cylinder 1.

The electronic control device 7 controls opening and closing of each of the solenoid valves V1, V2 and also controls actuation of the motor 12 for the slave cylinder A2, based on information obtained from various sensors such as the pressure sensors P, P and a stroke sensor, and programs stored in a storing unit in advance.

The slave cylinder A2 includes a base substance 10 with a cylinder bore 10a of a cylindrical shape having a bottom, slave pistons 11a, 11b that slide within the cylinder bore 10a, and the motor 12.

The base substance 10 is a metal component which is installed in the vehicle, in which the cylinder bore 10a is formed. Also, various components such as a reservoir are mounted on the base substance 10.

A first pressure chamber 10b is formed between the bottom of the cylinder bore 10a and the first slave piston 11a. A first coil spring 13a is housed in the first pressure chamber 10b. The first coil spring 13a is adapted to push the first slave piston 11a which has been moved to the side of the bottom of the cylinder bore 10a, back to the side of an opening of the cylinder bore 10a.

A second pressure chamber 10c is formed between the first slave piston 11a and the second slave piston 11b. A second coil spring 13b is housed in the second pressure chamber 10c. The second coil spring 13b is adapted to push the second slave piston 11b which has been moved to the side of the bottom of the cylinder bore 10a, back to the side of the opening of the cylinder bore 10a.

The motor 12 ("electric actuator" set forth in the claims) is an electric servo motor which is driven and controlled by the electronic control device 7 for the input device A1.

The motor 12 is mounted on a lateral face of the base substance 10. Also, a rod 12a protruding from the motor 12 is inserted into the cylinder bore 10a.

A driving force transmission unit is housed in a case of the motor 12, which converts a rotary driving force of an output shaft of the motor 12 to an axial force in a linear direction. The driving force transmission unit is constituted by, for example, a ball screw mechanism. When the rotary driving force of the output shaft of the motor 12 is input to the driving force transmission unit, the axial force in the linear direction is given by the driving force transmission unit to the rod 12a to allow the rod 12a to move back and forth in the axial direction.

A tip section of the rod 12a abuts on the second slave piston 11b. Accordingly, when the rod 12a is moved to the side of the bottom of the cylinder bore 10a, both of the slave pistons 11a, 11b receive inputs from the rod 12a to slide within the cylinder bore 10a, thereby pressurizing respective brake fluids in both of the pressure chambers 10b, 10c.

Next, description will be given of each of the fluid pressure passages formed in the base substance 10 of the slave cylinder A2.

A first communication fluid pressure passage 9f is a fluid pressure passage which starts from the first pressure chamber 10b in the cylinder bore 10a. A piping tube Hc branching from the piping tube Ha is connected to a lead-out port which is an end point of the first communication fluid pressure passage 9f.

A second communication fluid pressure passage 9g is a fluid pressure passage which starts from the second pressure chamber 10c in the cylinder bore 10a. A piping tube Hd branching from the piping tube Hb is connected to a lead-out port which is an end point of the second communication fluid pressure passage 9g.

The fluid pressure control device A3 is adapted to control brake hydraulic pressures to be given to each of wheel cylinders W of wheel brakes, and includes constitutions capable of performing an antilock brake control, a skid control for stabilizing behavior of the vehicle, a traction control and the like.

Note that the fluid pressure control device A3 includes, although not illustrated, a fluid-pressure unit having solenoid valves and pumps provided therein, a motor for driving the pumps, an electronic control device for controlling the solenoid valves and the motor, and the like.

The fluid pressure control device A3 is connected via the piping tubes Ha, Hb to the input device A1, and is also connected via the piping tubes Ha, Hc and Hb, Hd to the slave cylinder A2. Moreover, the fluid pressure control device A3 is connected via piping tubes to each of the wheel cylinders W.

Next, the operation of the vehicle brake system A will be generally described.

In the vehicle brake system A, when the stroke sensor detects depression of the brake pedal B, the electronic control device 7 switches both of the normally-open type solenoid valves V1, V1 to the valve-closed state. This causes communication between the upstream side and the downstream side of both of the main fluid pressure passages 9a, 9b to be broken.

On the other hand, the electronic control device 7 brings the normally-closed type solenoid valve V2 into the valve-open state. This allows brake fluid to flow from the first main fluid pressure passage 9a through the branch fluid pressure passage 9e into the stroke simulator 2.

Both of the pistons 1a, 1b in the master cylinder 1 receive a pedal effort on the brake pedal B to slide to the side of the bottom within the first cylinder bore 1g, thereby pressurizing respective brake fluids in both of the pressure chambers 1e, 1f. At this time, since communication between the upstream side and the downstream side of both of the main fluid pressure passages 9a, 9b is broken, brake hydraulic pressures generated in both of the pressure chambers 1e, 1f are not transmitted to the wheel cylinders W.

Also, when brake fluid in the first pressure chamber 1e is pressurized, the brake fluid flows from the first main fluid pressure passage 9a into the branch fluid pressure passage 9e. Then, brake fluid in the pressure chamber 2e of the stroke simulator 2 is pressurized to cause the piston 2a to move to the side of the lid member 2d against biasing forces of the coil springs 2b, 2c.

This allows the brake pedal B to stroke and the biasing forces of the coil springs 2b, 2c to be exerted on the piston 2a toward the side of the bottom of the cylinder bore 2g, thereby giving a pseudo operational reaction force to the brake pedal B.

Moreover, when the stroke sensor detects depression of the brake pedal B, the motor 12 for the slave cylinder A2 is driven.

Then, the electronic control device 7 compares a brake hydraulic pressure generated by the slave cylinder A2 with a brake hydraulic pressure generated by the master cylinder 1 and, based on a result of the comparison, controls the number of revolutions of the motor 12, and the like.

In the slave cylinder A2, both of the slave pistons 11a, 11b receive inputs from the rod 12a to slide to the side of the bottom within the cylinder bore 10a, thereby pressurizing respective brake fluids in both of the pressure chambers 10b, 10c.

Thus, the slave cylinder A2 generates a brake hydraulic pressure depending on the amount of stroke of the brake pedal B.

The brake hydraulic pressure generated by the slave cylinder A2 is supplied from the piping tubes Hc, Hd through the piping tubes Ha, Hb to the fluid pressure control device A3.

Then, the brake hydraulic pressure is transmitted from the fluid pressure control device A3 to each of the wheel cylinders W to actuate each of the wheel cylinders W, thereby giving a braking force to each of the wheels.

Note that in a state of the slave cylinder A2 being not actuated (e.g., in a case where electric power is not obtained), both of the solenoid valves V1, V1 are in the valve-open state and thus the upstream side and the downstream side of both of the main fluid pressure passages 9a, 9b are communicated with each other. On the other hand, the solenoid valve V2 is in the valve-closed state.

In this state, brake hydraulic pressures in both of the main fluid pressure passages 9a, 9b are boosted by the master cylinder 1. Then, brake hydraulic pressures in the wheel cylinders W communicating with both of the main fluid pressure passages 9a, 9b are boosted to give a braking force to each of the wheels.

Next, the input device A1 according to the present embodiment will be described in detail.

As shown in FIG. 2, the input device A1 includes the base substance 100, the master cylinder 1 and the stroke simulator 2 provided inside the base substance 100, and the electronic control device 7 mounted on a mounting face 110 of the base substance 100.

The input device A1 is mounted on a front face of a dashboard which divides an engine room from a vehicle interior.

The base substance 100 is a metallic block and formed in a larger size in the front-rear direction than in the right-left direction, and its rear end portion is broadened in the right-left direction.

In the present embodiment, the front-rear direction of the base substance 100, the right-left direction thereof, and the up-down direction thereof indicate directions viewed when the input device A1 is installed in the vehicle.

Figure 4:
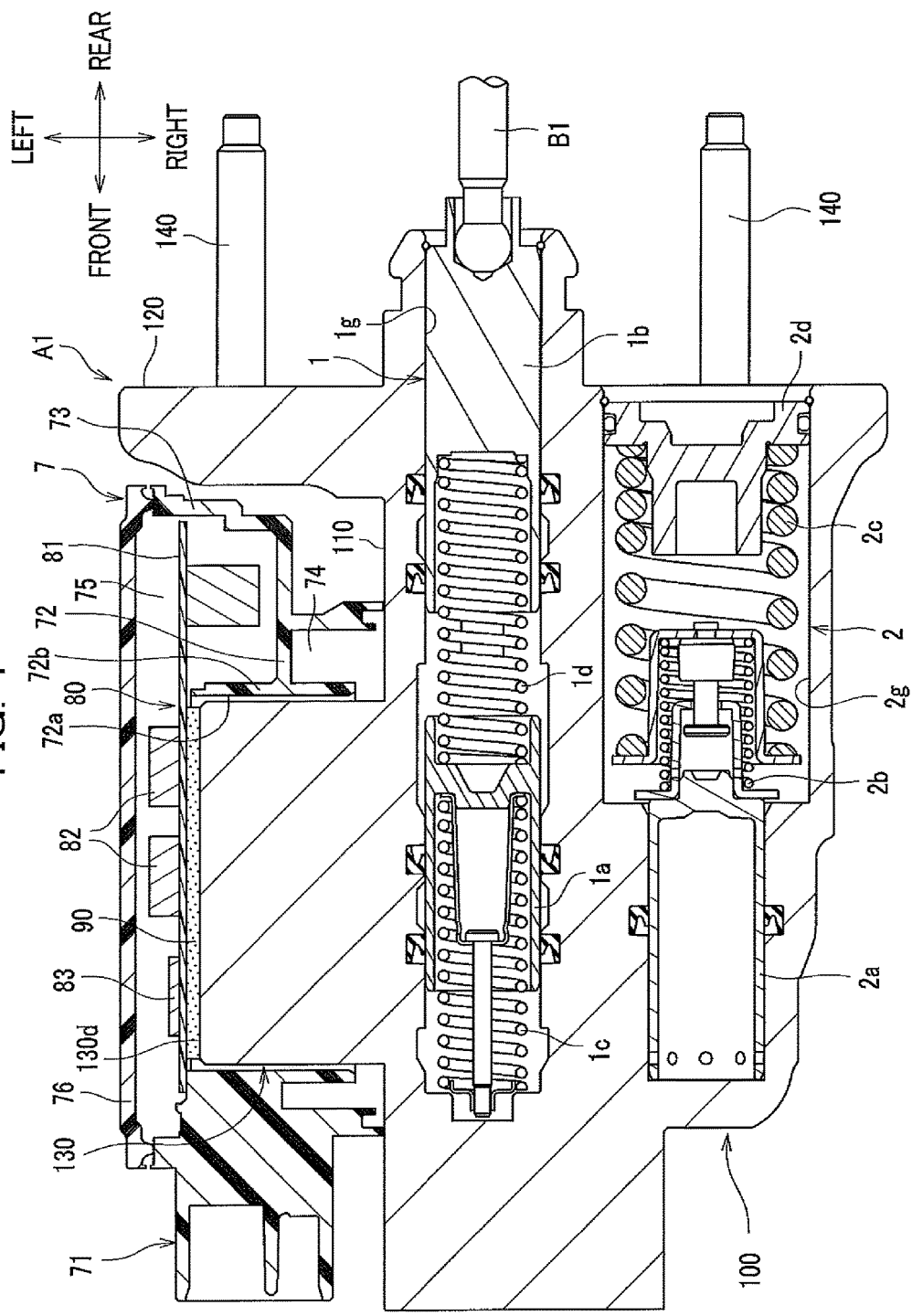
FIG. 4 is a view showing the input device according to the present embodiment, and is a cross-sectional view taken along the A-A line in FIG. 3A.

As shown in FIG. 4, the first cylinder bore 1g of the master cylinder 1 and the second cylinder bore 2g of the stroke simulator 2 are formed inside the base substance 100. The cylinder bores 1g, 2g are provided side by side in the right-left direction of the vehicle and extend in the front-rear direction.

Figure 3A:
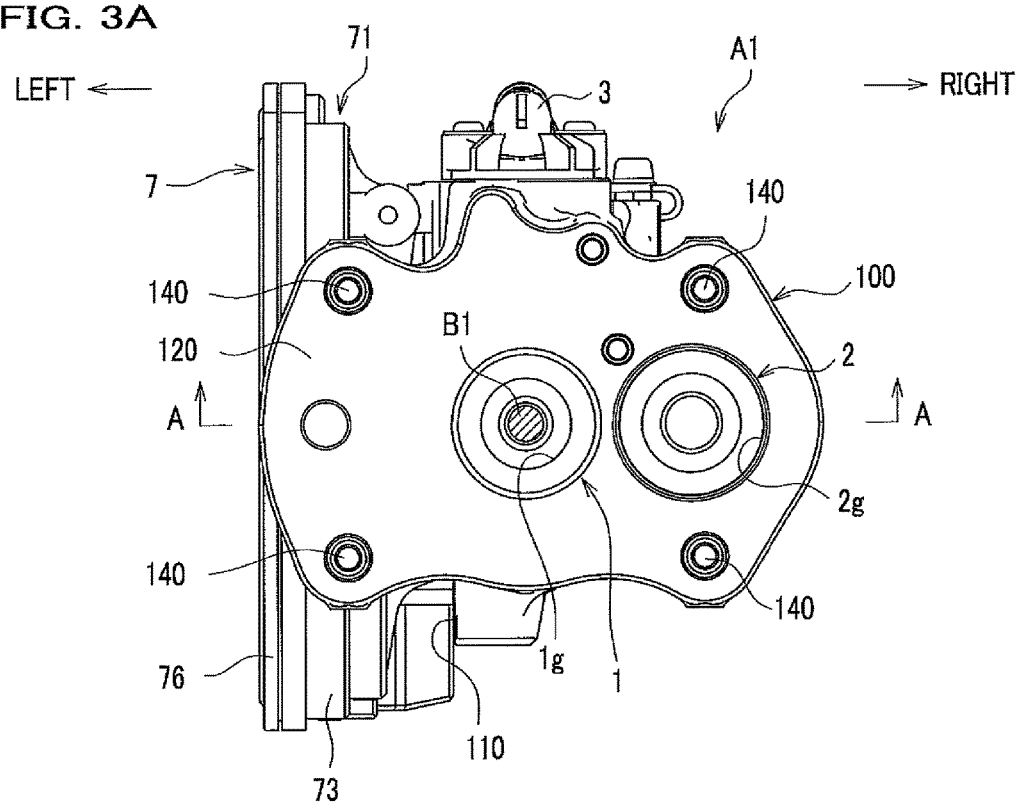

In the present embodiment, as shown in FIG. 3A, the first cylinder bore 1g is arranged in the central region of the base substance 100, and the second cylinder bore 2g is arranged in the right side of the first cylinder bore 1g.

The base substance 100 has a rear end face 120 which is mounted on the front face of the dashboard. As shown in FIG. 2, a stud 140 is vertically provided at four corners in the up-down and right-left directions of the rear end face 120, respectively.

When the base substance 100 is mounted on the front face of the dashboard, each of the studs 140 is inserted into a mounting hole of the dashboard to allow a tip of the stud 140 to be firmly fixed to a vehicle body frame.

The left side surface of the base substance 100 is the mounting face 110 on which the electronic control device 7 is mounted.

A plurality of mounting holes 111 are formed in a region of an upper half the mounting face 110, and electric components such as the solenoid valves V1, V2 and the pressure sensors P, P are attached to the mounting holes 111.

Figure 3B:
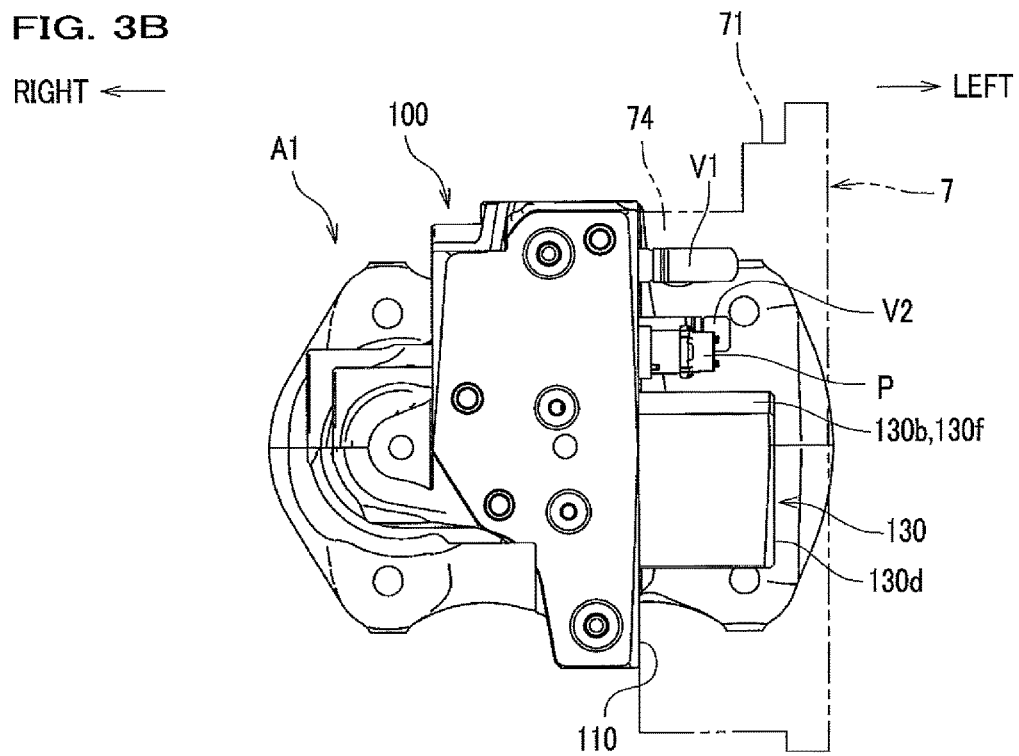

As shown in FIG. 3B, respective tips of the solenoid valves V1, V2 and the pressure sensors P, P attached to the mounting holes 111 protrude from the mounting face 110.

As shown in FIG. 2, a heat dissipating part 130 having the form of a nearly rectangular parallelepiped is provided in a protruding manner in a region of a lower half the mounting face 110. The heat dissipating part 130 is a solid protruding part formed integral with the base substance 100. The heat dissipating part 130 is formed in a larger size in the right-left direction than in the up-down direction.

As shown in FIG. 5, the heat dissipating part 130 is configured to be located below the solenoid valves V1, V2 and the pressure sensors P, P in the vertical direction when the input device A1 is installed in the vehicle. Thus, the solenoid valves V1, V2 and the pressure sensors P, P, and the heat dissipating part 130 are provided side by side in the up-down direction on the mounting face 110.

As shown in FIG. 3B, the heat dissipating part 130 is formed to have a higher height (the amount of protrusion from the mounting face 110) than respective heights (the amount of protrusion from the mounting face 110) of the solenoid valves V1, V2 and the pressure sensors P, P.

As shown in FIG. 5, a slant face 130b is formed in the front on a top face 130a of the heat dissipating part 130, which is slanted downward and toward a front end of the heat dissipating part 130. More specifically, the slant face 130b which is slanted toward the side opposite to the side of the pressure sensor P located in the front side is formed in the front on the top face 130a of the heat dissipating part 130. The slant face 130b of the heat dissipating part 130 faces the pressure sensor P located in the front side and thus the pressure sensor P lies close to the slant face 130*b*.

Thus, a corner portion of the front and upper side of the heat dissipating part 130 has a shape which is obtained by cutting out a virtual corner portion obtained when the top face 130*a* and a front end face 130*c* are squared with each other. More specifically, formed on the corner portion of the front and upper side of the heat dissipating part 130 is a cut-out portion 130*f* which is set back to keep away from the pressure sensor P located in the front side.

As shown in FIG. 4, the electronic control device 7 is mounted on the mounting face 110 of the base substance 100 (see FIG. 2).

The electronic control device 7 includes a housing 71 which is a body made of synthetic resin, and a control board 80 housed in the housing 71.

As shown in FIG. 1, the electronic control device 7 in the present embodiment controls opening and closing of each of the solenoid valves V1, V2 in the input device A1 and also controls actuation of the motor 12 for the slave cylinder A2.

As shown in FIG. 2, the housing 71 includes a nearly rectangular partition member 72 and a peripheral wall portion 73 surrounding the partition member 72. The peripheral wall portion 73 is set up vertically on one side (left side) and the other side (right side) from the periphery of the partition member 72.

As shown in FIG. 4, the housing 71 is firmly fixed to the mounting face 110 with the solenoid valves V1, V2 and the pressure sensors P, P protruding from the mounting face 110 of the base substance 100 being covered (see FIGS. 3A and 3B).

A mounting hole (not shown) is formed at four corners of the peripheral wall portion 73 of the housing 71, respectively. A bolt inserted into each of the mounting holes is screwed into a screw hole formed in the base substance 100 to allow the housing 71 to be firmly fixed to the mounting face 110 of the base substance 100.

Moreover, an opening on the one side (left side) of the housing 71 is sealed by a cover 76 made of synthetic resin (see FIG. 2).

The inner space of the housing 71 is partitioned by the partition member 72 into spaces on the one side (left side) and the other side (right side). A first housing chamber 74 is formed between the partition member 72 and the mounting face 110, and a second housing chamber 75 is formed on the side (the side of the cover 76) opposite to the side of the mounting face 110 across the partition member 72.

The first housing chamber 74 is a space in which the solenoid valves V1, V2 and the pressure sensors P, P protruding from the mounting face 110 are housed, and the second housing chamber 75 is a space in which the control board 80 is housed.

The partition member 72 is a plate-like member which is spaced from and faces the mounting face 110, and has a rectangular opening 72*a* into which the heat dissipating part 130 protruding from the mounting face 110 is inserted (see FIG. 2).

Moreover, the partition member 72 has a cylindrical wall portion 72*b* which is formed along the periphery of the opening 72*a*. The cylindrical wall portion 72*b* is set up on one surface and the other surface of the partition member 72.

The heat dissipating part 130 is inserted into the opening 72*a* and the cylindrical wall portion 72*b* of the partition member 72, and a tip section (left end portion) of the heat dissipating part 130 protrudes into the second housing chamber 75. Thus, a tip face 130*d* of the heat dissipating part 130 lies closer to the control board 80 than the partition member 72.

The control board 80 is adapted to control actuation of each of the solenoid valves V1, V2 in the input device A1 (see FIG. 1) and control actuation of the motor 12 for the slave cylinder A2 (see FIG. 1), based on information obtained from various sensors and programs stored in a storing unit in advance.

The control board 80 includes a rectangular substrate body 81 on which electronic circuits are printed and electronic components are mounted (see FIG. 2).

The control board 80 is firmly fixed to a fixed part which is provided to protrude from the one surface of the partition member 72, to thereby be mounted in a stepped state on the partition member 72.

As shown in FIG. 5, the control board 80 in the present embodiment has a rectangular component mounting area 80*a* provided thereon. The component mounting area 80*a* is formed in a larger size in the front-rear direction than in the up-down direction, and is formed in a smaller size than the tip face 130*d* of the heat dissipating part 130.

Six FETs (Field Effect Transistors) 82 for motor and two resistance components 83 for current detection are mounted on the component mounting area 80*a*.

As shown in FIG. 4, the heat dissipating part 130 protrudes into the second housing chamber 75 through the opening 72*a* of the partition member 72. Also, the tip face 130*d* (left end surface) of the heat dissipating part 130 abuts on a reverse side of the component mounting area 80*a* (see FIG. 5) on the control board 80.

Viscous grease 90 ("heat conducting member" set forth in the claims) is coated on the tip face 130*d* of the heat dissipating part 130.

Thus, the tip face 130*d* of the heat dissipating part 130 abuts on the control board 80 through the grease 90.

Note that the form of the grease 90 is not specifically limited and various greases such as oil-based grease and silicone grease can be used.

In the input device A1 configured as described above, since the heat dissipating part 130 provided to protrude from the mounting face 110 of the base substance 100 abuts on the control board 80 through the grease 90, heat of the control board 80 is conducted from the heat dissipating part 130 to the entire base substance 100. Moreover, since the base substance 100 is a metallic block disposed in a large space within the engine room, the heat is allowed to be efficiently dissipated from the base substance 100. Accordingly, even where the amount of heat generation of the control board 80 is large, the heat of the control board 80 can be sufficiently dissipated through the base substance 100 to suppress an increase in temperature of the control board 80.

Where the electronic control device 7 controls operations of the input device A1 and the slave cylinder A2 (see FIG. 1) as in the vehicle brake system A (see FIG. 1) according to the present embodiment, electronic components on the control board 80 increase in number and thus heat of the control board 80 becomes large. The input device A1 according to the present embodiment, however, makes it possible to sufficiently dissipate the heat of the control board 80 through the base substance 100, thereby suppressing an increase in temperature of the control board 80.

Also, in the input device A1, the heat dissipating part 130 on the base substance 100 abuts on the control board 80 through the grease 90. This configuration makes it possible to prevent a gap from being generated between the heat dissipating part 130 and the control board 80.

Moreover, in the input device A1 as shown in FIG. 5, the electronic components (FETs 82 for motor and resistance components 83 for current detection) are mounted on the component mounting area 80a, and the heat dissipating part 130 abuts on the reverse side of the component mounting area 80a.

Consequently, in the input device A1, heat of the electronic components on the control board 80 is directly conducted to the heat dissipating part 130 and thus the heat of the control board 80 can be efficiently conducted to the base substance 100.

Also, in the input device A1 as shown in FIG. 4, the heat dissipating part 130 is inserted into the cylindrical wall portion 72b formed on the partition member 72 (see FIG. 2). The cylindrical wall portion 72b prevents heat from the heat dissipating part 130 from being conducted to spaces within both of the housing chambers 74, 75, thereby suppressing an increase in temperature within the housing 71.

Moreover, in the input device A1 as shown in FIG. 3B, the heat dissipating part 130 is located below the solenoid valves V1, V2 and heat of the solenoid valves V1, V2 is dissipated upward, thereby preventing the heat of the solenoid valves V1, V2 from being conducted to the control board 80 through the heat dissipating part 130.

Furthermore, in the input device A1 as shown in FIG. 5, the solenoid valves V1, V2 and the pressure sensors P, P, and the heat dissipating part 130 are provided side by side in the up-down direction in the housing 71. In addition, the cut-out portion 130f is formed in the front on the top face 130a of the heat dissipating part 130, thereby allowing the heat dissipating part 130 to lie close to the pressure sensor P located in the front side. Thus, the heat dissipating part 130 and the electric components can be compactly arranged to downsize the housing 71.

Although one embodiment of the present invention has been described above, the present invention is not limited to the above embodiment and can be appropriately modified within the scope not departing from the gist of the invention.

Although the present embodiment has been described, taking the case in which the vehicle control device according to the present invention is applied to the input device A1 of the vehicle brake system A shown in FIG. 1, for example, the vehicle control device according to the present invention can be applied to various control devices installed in the vehicle. For example, the vehicle control device can also be applied to the slave cylinder A2 and the fluid pressure control device A3 of the vehicle brake system A.

Although in the present embodiment, the heat dissipating part 130 abuts on the control board 80 through the grease 90 as shown in FIG. 4, the heat conducting member to be interposed between the heat dissipating part 130 and the control board 80 is not limited to the grease. For example, an elastic plate made of resin or rubber may be interposed between the heat dissipating part 130 and the control board 80.

Although in the present embodiment, one heat dissipating part 130 is provided to protrude from the mounting face 110 as shown in FIG. 2, a plurality of heat dissipating parts may be provided to protrude from the mounting face 110.

Moreover, location of the heat dissipating part 130 is not specifically limited and can be set taking into account layout of fluid pressure passages to be provided within the base substance 100 and electric components to be mounted on the base substance 100.

DESCRIPTION OF REFERENCE SIGNS

1: Master cylinder;
1a: First piston;
1b: Second piston;
1g: First cylindrical bore;
2: Stroke simulator;
2a: Piston;
2g: Second cylindrical bore;
3: Reservoir;
7: Electronic control device;
9a: First main fluid pressure passage;
9b: Second main fluid pressure passage;
9e: Branch fluid pressure passage;
9f: First communication fluid pressure passage;
9g: Second communication fluid pressure passage;
10: Base substance;
10a: Cylindrical bore;
10b: First pressure chamber;
10c: Second pressure chamber;
11a: First slave piston;
11b: Second slave piston;
12: Motor;
12a: Rod;
71: Housing;
72: Partition member;
72a: Opening;
73: Peripheral wall portion;
74: First housing chamber;
75: Second housing chamber;
76: Cover;
80: Control board;
80a: Component mounting area;
81: Substrate body;
82: FET for motor (Electronic component);
83: Resistance component for current detection (Electronic component);
90: Grease (Heat conducting member);
100: Base substance;
110: Mounting face;
120: Rear end face;
130: Heat dissipating part;
130a: Top face;
130b: Slant face;
130d: Tip face;
130f: Cut-out portion;
A: Vehicle brake system;
A1: Input device;
A2: Slave cylinder;
A3: Fluid pressure control device;
B: Brake pedal (Brake operation unit);
p: Pressure sensor (Electric component);
V1: Solenoid valve (Electric component);
V2: Solenoid valve (Electric component);
W: Wheel cylinder

What is claimed is:

1. A vehicle control device comprising:
   a metallic base substance having a mounting face and a heat dissipating part formed homogeneously thereon;
   an electronic control device mounted on the base substance, the electronic control device including a housing mounted on the base substance and enclosing the mounting face and a control board; and
   an electric component which is mounted on the control board in a component mounting area,
      wherein the heat dissipating part protrudes outwardly from the mounting face and abuts a reverse side of an entirety of the component mounting area on the control board,
      wherein the heat dissipating part and the metallic base substance are provided as a unitary component, wherein the housing includes a partition member formed to partition an inner space of the housing into spaces, including a first housing chamber surrounding the mounting face which is formed between the partition member and a peripheral wall portion of the housing, and a second housing chamber surrounding the heat dissipating part, wherein the partition member forms a lower opening of the housing into which the heat dissipating part is inserted, wherein the lower opening of the housing is sized to correspond to the heat dissipating part and the entirety of the component mounting area, wherein a plurality of electric components composed of solenoid valves and pressure sensors are disposed in a region of an upper half of the mounting face and the heat dissipating art is disposed in a region of a lower half of the mounting face.

2. The vehicle control device according to claim 1, wherein the heat dissipating part abuts on the control board through a heat conducting member.

3. The vehicle control device according to claim 1, further comprising a cut-out portion which is formed on a face of the heat dissipating part on the side of the electric component and set back toward the side opposite to the side of the electric component.

4. A vehicle brake system comprising:
a vehicle control device including:
    a metallic base substance having a mounting face and a heat dissipating part formed homogeneously thereon;
    an electronic control device mounted on the base substance, the electronic control device including
        a housing mounted on the base substance and enclosing the mounting face and a control board;
        an electric component which is mounted on the control board in a component mounting area,
    wherein the housing includes a partition member formed to partition an inner space of the housing into spaces, including a first housing chamber surrounding the mounting face which is formed between the partition member and a peripheral wall portion of the housing, and a second housing chamber surrounding the heat dissipating part,
    wherein the partition member forms a lower opening of the housing into which the heat dissipating part is inserted,
    wherein the lower opening of the housing is sized to correspond to the heat dissipating part and the entirety of the component mounting area,
    wherein the heat dissipating part protrudes outwardly from the mounting face and abuts a reverse side of an entirety of the component mounting area on the control board,
    wherein the heat dissipating part and the metallic base substance are provided as a unitary component,
    wherein a plurality of electric components composed of solenoid valves and pressure sensors are disposed in a region of an upper half of the mounting face and the heat dissipating part is disposed in a region of a lower half of the mounting face; and
a slave cylinder that generates a brake hydraulic pressure through driving of an electric actuator,
the vehicle control device further including:
    the base substance having a cylindrical bore;
    a piston which is inserted into the cylindrical bore and to which a brake operation unit is connected; and
    the electronic control device that controls the electric actuator.

* * * * *